US006290779B1

(12) United States Patent
Saleh et al.

(10) Patent No.: US 6,290,779 B1
(45) Date of Patent: Sep. 18, 2001

(54) SYSTEMS AND METHODS FOR DRY CLEANING PROCESS CHAMBERS

(75) Inventors: Zaki Saleh, Newbury Park, CA (US); Richard A. Comunale, Ipswich, MA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/330,773

(22) Filed: Jun. 11, 1999

Related U.S. Application Data

(60) Provisional application No. 60/089,117, filed on Jun. 12, 1998.

(51) Int. Cl.[7] .......... C23G 5/00

(52) U.S. Cl. .......... 134/2; 134/1.1; 134/8; 134/21; 134/26; 134/30; 134/22.1; 216/67

(58) Field of Search .......... 134/1.1, 2, 8, 21, 134/22.1, 26, 30; 216/67

(56) References Cited

U.S. PATENT DOCUMENTS

| | | | | |
|---|---|---|---|---|
| 5,427,621 | | 6/1995 | Gupta | 134/1 |
| 5,517,943 | * | 5/1996 | Takahashi | 118/715 |
| 5,546,890 | | 8/1996 | Tamaki et al. | 117/102 |
| 5,565,038 | | 10/1996 | Ashley | 134/2 |
| 5,609,721 | * | 3/1997 | Tsukune et al. | 156/646.1 |
| 5,616,208 | | 4/1997 | Lee | 156/345 |
| 5,693,147 | | 12/1997 | Ward et al. | 134/1.1 |
| 5,707,451 | | 1/1998 | Robles et al. | 118/715 |
| 5,817,181 | * | 10/1998 | Okamura et al. | 134/1.1 |
| 6,164,295 | * | 12/2000 | Ui et al. | 134/1.1 |

* cited by examiner

*Primary Examiner*—Randy Gulakowski
*Assistant Examiner*—Michael Kornakov
(74) *Attorney, Agent, or Firm*—Wood, Herron & Evans, LLP

(57) ABSTRACT

Chlorine trifluoride ($ClF_3$) is an excellent chemistry for in-situ cleaning of process equipment for chemical vapor deposition (CVD) of metals. $ClF_3$ is a weakly-bound molecule that breaks down exothermically on contact with most hot conducting films such as Ti and TiN without plasma, giving it an advantage over other chemistries. The energy released from the reaction is used to volatize the reaction byproducts. Cooler reactor surfaces, however, are coated with a halogen-rich, less conductive film that may not be as reactive with $ClF_3$. To improve the $ClF_3$ reaction, additives such as nitrous dioxide are employed. These additives react with $ClF_3$ and supply reactive ions energetic enough to volatize the byproduct.

17 Claims, 1 Drawing Sheet

SYSTEMS AND METHODS FOR DRY CLEANING PROCESS CHAMBERS

This application claims the benefit of U.S. Provisional Application Ser. No. 60/089,117, filed Jun. 12, 1998.

FIELD OF THE INVENTION

The invention relates to the maintenance of semiconductor manufacturing equipment, and more specifically, to systems and methods for cleaning the interior of a processing chamber.

BACKGROUND OF THE INVENTION

New techniques and processes for manufacturing semiconductor devices have created new challenges for maintaining and operating the machines in which semiconductor devices are made.

The manufacture of semiconductor devices, such as microprocessors and memory chips, is primarily carried out by chemical processes. Machines called reactor chambers implement these processes, the most common of which is a process known as chemical vapor deposition (CVD). CVD, as the name implies, is a chemical process that allows a manufacturer to deposit, or grow, layers of material onto the surface of a substrate, such as a silicon wafer. To carry out the CVD process, the reactor chamber will create an environment around the substrate of selected process conditions. Typically this involves controlling the temperature and pressure within the chamber. A gas delivery system introduces reactant materials into the chamber. By maintaining the proper environment and by introducing the proper materials, the CVD reaction will occur and the gaseous reactant materials will form, or deposit, a solid phase material onto the surface of the substrate. Each layer of solid phase material is formed into a pattern, typically by photolithography, or by an etching process. By depositing multiple layers of different patterns onto the substrate, a complete semiconductor device can be formed.

As one might expect, these chemical processes can lead to the build up of solid material on the walls and components of the reactor chamber. Over time, these deposits accumulate and eventually form a thick film of byproduct, or waste, material that coats the inside of the chamber. This film of material becomes a source of particulate matter that is harmful to the formation of a semiconductor device. Specifically, it is known that this film can flake off the reactor walls during thermal expansion and contraction of the processing equipment, and in some cases due to reactions with moisture. The flaked-off byproduct can contaminate the substrates being processed within the chamber and prevent the deposition of device quality films.

Contaminants can be removed from the walls of the chamber and the reactor components by opening the chamber and cleaning manually the chamber walls with a liquid solvent, much like the interior of an oven is cleaned. Although this process can work, the procedure is labor intensive and time consuming as a high degree of cleanliness is required.

To provide a better solution, alternative cleaning procedures have been developed including in-situ cleaning processes during which gaseous agents are fed into the chamber and reacted with the byproduct material to cause the byproduct material to dissolve into the agent and exhaust from the chamber. In some of these processes, the reagent is fed into the chamber and a plasma is struck. The plasma is understood to assist in the break-up of reagent molecules and to provide reactive etch ions for the cleaning process. Several such plasma-assisted processes are known, including processes based on $NF_3$, $SF_6$ and $C_2F_4$ reagents.

Chlorine trifluoride ($ClF_3$) is a cleaning agent that can clean reactor walls even in the absence of a plasma. $ClF_3$ is a weakly bound molecule that dissociates exothermically on contact with most hot metal surfaces. The energy released from this exothermic reaction is used to volatize the reaction byproduct which can then be pumped out of the chamber and to an appropriate abatement station leaving the reactor surfaces clean. The plasma-independent capability of the $ClF_3$ cleaning agent gives it a major advantage over other cleaning agents. For example, $ClF_3$ reacts with and cleans surfaces that are not accessible to a plasma, such as reactor walls, the backside of a heater stage and even exhaust lines.

However, new metal CVD technologies create byproducts that challenge the existing techniques of in-situ cleaning. In particular, many new metalization techniques employ halogen based precursor gases that give rise to residual films that are rich in halogen as well as metal. These films have proven more resistant to existing cleaning techniques than the silicon based films produced during silicon deposition. This leaves unclean surfaces that can contaminate the wafers being processed. Longer cleaning times have been proposed as a solution, but the results achieved have been mixed and the delay incurred adds to the expense of operating the semiconductor production equipment, and increases cleaning costs by increasing the use of $ClF_3$, a relatively expensive reagent.

Accordingly, there is a need in the art to provide improved cleaning techniques, including techniques more suited to removing films created during metal CVD processes.

SUMMARY OF THE INVENTION

One aspect of the invention to provide an improved in-situ cleaning process.

Another aspect of the invention to provide a more cost effective cleaning process by providing an expeditious cleaning reaction with a reduced reliance on expensive cleaning materials.

Existing techniques for in-situ cleaning have failed to provide efficient and cost effective cleaning processes for removing the films deposited on reactor chamber walls and components during metal CVD processes. In the reactors being developed for these metal CVD processes, applicants have found that cooler reactor surfaces can be coated with halogen-rich and less conductive deposits that may not be sufficiently reactive with $ClF_3$. The weak reaction with $ClF_3$ is understood to achieve a mere fluorination of the deposits with nonvolatile byproducts. This leaves the surfaces uncleaned. As discussed above, longer cleaning times have been proposed as a solution, but the results achieved have been mixed and the delay incurred adds to the expense of operating the semiconductor production equipment and increases cleaning costs by increasing the use of $ClF_3$.

In the systems and methods described herein, reactive additives, such as nitrous oxide ($N_2O$) or nitrous dioxide ($N_2O_2$) and oxygen ($O_2$), are employed with the cleaning reagent to expedite the reaction and produce more volatile species upon contact with halogen and metal containing byproduct films. In a preferred practice, the reagent and oxidizing additive react with the byproduct film to produce a volatile byproduct that can be pumped out of the reactor.

DETAILED DESCRIPTION OF THE ILLUSTRATED EMBODIMENTS

The invention will now be described with reference to certain illustrative embodiments, and in particular, with reference to systems and methods for cleaning metallic films from the surface of a reactor chamber. However, it will be understood by one of ordinary skill in the art that the systems and methods described herein can be employed in other applications including processes for removing other type films, including films primarily comprised of silicon, such as silicon oxide films.

Figure 1:
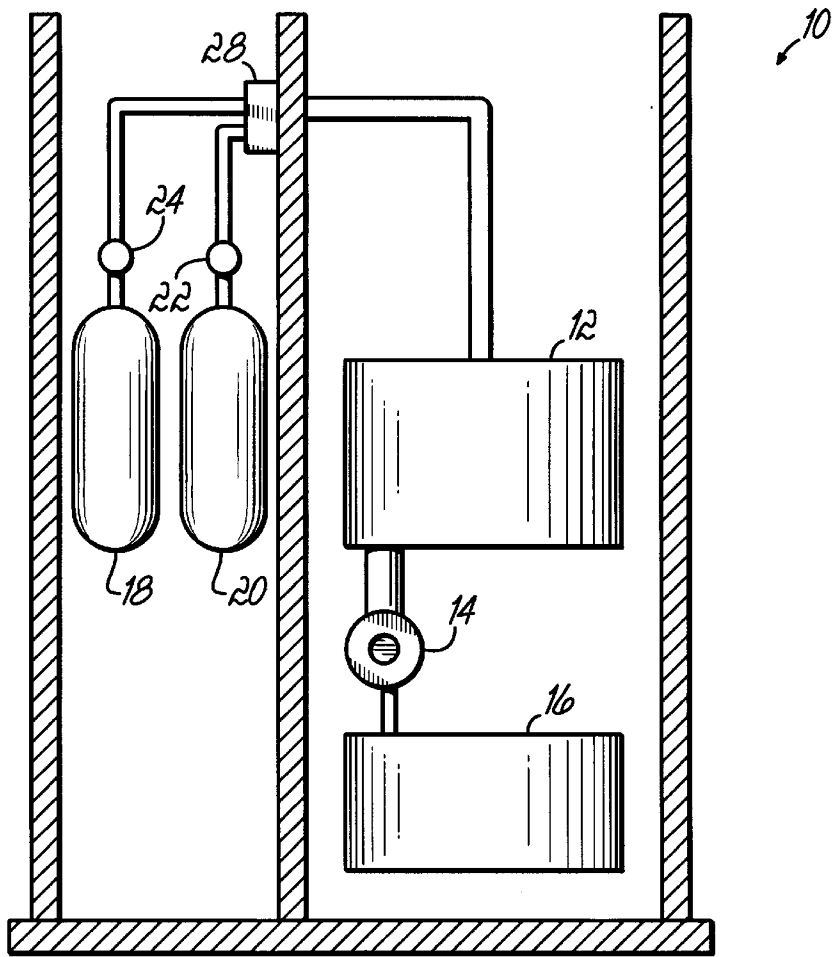
FIG. 1 depicts one system for performing a process described herein.

FIG. 1 depicts a system 10 capable of carrying out the cleaning processes described herein. Specifically, the system 10 includes a reactor chamber 12, a pump 14, a scrubber 16, a first reservoir 18 for storing a cleaning gas and a second reservoir 20 for storing an oxidizing gas, valves 22, 24 and a mass flow control unit 28.

Reactor chamber 12, pump 14 and scrubber 16 can be employed to deposit a film onto a substrate, such as for depositing a Ti or TiN film onto a surface of a silicon substrate. Accordingly, the system 10 depicted in FIG. 1 allows for a metal CVD process to be carried out within the reactor chamber 12 by introducing precursor gases into the chamber at selected temperatures for reacting the gases therein and depositing onto a silicon substrate contained within the chamber 12 a film of a desired material. The pump 14 and scrubber 16 can be employed for removing from the interior of the chamber 12 those gases that have been reacted in the deposition process and are not essentially waste materials that have to be recycled in an environmentally appropriate way.

As can be seen from the above description, the CVD processes for depositing films onto a substrate rely on gaseous materials which are injected into the interior of a chamber, such as the chamber 12. These gaseous materials will fill the interior volume of the chamber 12 causing reactions to occur substantially within the entirety of the chamber. Therefore, although a film will form onto a substrate inserted into the chamber, a film is also likely to form onto the sidewalls, bottom walls, and interior components of the chamber 12. This process of forming films onto the sidewalls and components of chamber 12 is seen more readily from FIG. 2.

Figure 2:
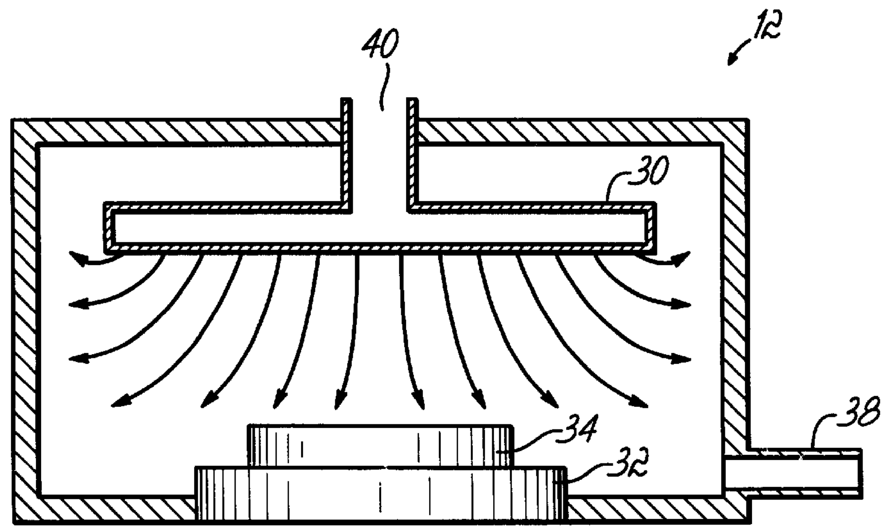
FIG. 2 depicts in cross-section a functional block diagram of the interior of a reactor chamber, such as the reactor chamber depicted in FIG. 1.

In particular, FIG. 2 depicts a cross sectional view of the interior of the chamber 12 depicted in FIG. 1. The chamber 12 includes a showerhead 30, a heater stage 32 carrying a substrate 34 thereon, an exhaust port 38 and an entry port 40. It will be understood by those of ordinary skill in the art that in the CVD processes described above, precursor gases are flowed through the entry port 40 and distributed across the interior volume chamber 12 by the showerhead 30. The substrate 34 is maintained on heater stage 32 which by operation of a thermal control unit can maintain the substrate 34 at a selected elevated temperature. The precursor gases flowed into the interior of chamber 12 can react with the substrate 34 for depositing a metal containing film onto the substrate 34. However, as the heater stage 32 is typically also at an elevated temperature, it will be understood that precursor will react with the heater stage 34 for depositing a film thereon. Similarly, films can be deposited upon the sidewalls of the chamber 12, the bottom wall of the chamber 12 and within the interior of the exhaust port 38. Typically, during the deposition process good quality films are deposited onto the substrate and onto the edge of the heater stage, while poorer quality films are deposited onto the cooler showerhead 30. Furthermore, the even cooler surfaces of the walls and chamber bottom of the reactor chamber 12 and the exhaust line 38 are coated with a black film consisting of $TiI_x$.

The processes of the invention will now be described with reference to a certain exemplary practice in which waste films generated during the deposition of titanium and titanium nitride films are cleared from the heater stage, showerhead, sidewalls and exhaust lines of a reactor chamber, such as the reactor chamber 12 depicted in FIG. 1. However, it will be understood by those of ordinary skill in the art that the processes described herein are suitable for use in other applications, including applications in which silicones and silicon oxide films are removed from the interior portions and components of a reactor chamber.

EXAMPLE 1

Processing modules each consisting of a vacuum chamber (reactor), a cold trap, a dry pump and a scrubber were used to deposit Ti and TiN films from a titanium tetraiodide ($TiI_4$) precursor. The wall and showerhead of the process chamber were made of Inconel 600 alloy and held at about 200° C. while the stage heater (susceptor) was alumina-coated Inconel 600 and held at 500° C. to 660° C. during deposition, depending on the application. The chamber is equipped with plasma capability in a parallel-plate capacitor configuration with the heater stage acting as the ground and the showerhead as the driven RF electrode. The driven electrode (showerhead) is insulated from the grounded chamber cover by a thick (~30 mm) quartz disk and from its supporting clamp by solid alumina rings.

$ClF_3$ cleaning is performed at a heater temperature of 300° C. and at a nominal wall and showerhead temperature of 200° C. following the deposition of 2 $\mu$m Ti or 5 $\mu$m TiN film. It has been our experience that thermal $ClF_3$ would clean the Ti or TiN film off the heater stage but leaves black byproduct that was found to consist of $TiI_x$, $TiF_y$ and $TiCl_z$ with varying degrees of halogen concentrations (x, y, z) depending on cleaning temperature and time. Even after extended cleaning times for both Ti and TiN reactors, the resulting cleans are unsatisfactory. Striking a plasma during the clean accelerated the $ClF_3$ reaction and produced a white, fluorine-rich but still nonvolatile byproduct, identified by energy dispersive x-ray fluorescence spectroscopy (EDS) technique to be a mixture of metal halides $NiF_x$, $CrF_x$ and $FeF_x$.

To improve chamber cleaning, nitrous oxide ($N_2O$) was added to $ClF_3$ during the cleans. Visual inspection of the reactors following the initial cleans was promising. Instead of the black powder byproduct that was consistently left after $ClF_3$-only cleaning, only a very light coating of the walls could be found with $N_2O$ mixing. Striking a plasma after a preset time of thermal $ClF_3/N_2O$ flow has shown further improvement and more satisfactory cleaning results. Reducing cleaning pressure to 0.1 Torr or less by reducing the flows of $ClF_3$ and $N_2O$ to 100 sccm each, increases the mean free path of the reactive species and emphasizes the cleaning of the wall and bottom plate of the process reactor. By optimizing the cleaning parameters further, the following two-step clean recipe was developed:

Step 1: 0.5 slm $ClF_3$, 0.5 slm $N_2O$, 0.2 slm $N_2$, 0.2 Torr, 300° C. heater temperature, 200° C. wall and showerhead temperature.

Step 2: 0.1 slm $ClF_3$, 0.1 slm $N_2O$, 0.1 slm $N_2$, 0.1 Torr, 300° C. heater temperature, 200° C. wall and showerhead temperature.

The role of $N_2O$ in improving $ClF_3$ cleaning can be summarized as follows: after the Ti and TiN film is etched off the stage heater, the $ClF_3$ reaction subsides and a decreasing fraction of $ClF_3$ molecules is able to dissociate. Added $N_2O$ acts as a catalyst for further $ClF_3$ dissociation according to the following reaction:

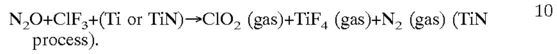

$N_2O+ClF_3+(\text{Ti or TiN})\rightarrow ClO_2\ (\text{gas})+TiF_4\ (\text{gas})+N_2\ (\text{gas})$ (TiN process).

This analysis is supported by the Fourier Transform Infra Red (FTIR) technique which was used to examine the exhaust of cleaning reactions on the Ti process module. In this technique, IR light makes multiple reflections through the exhaust line downstream of the process chamber and then to a detector. The IR light is absorbed by the various absorption modes of molecules in the cleaning exhaust. The characteristic absorption peaks of these molecules identify their molecular structure and subsequently the chemical composition of the pumped species. Results of these tests show the following:

$ClF_3$ concentration downstream of process chamber decreases as $N_2O$ is added indicating that $N_2O$ does accelerate the dissociation rate of $ClF_3$.

Titanium tetrafluoride ($TiF_4$) concentration downstream of the process chamber increases more rapidly with $N_2O$ flow indicating that $N_2O$ makes the cleaning process (removal of Ti) more efficient.

Metal fluoride concentration downstream of the chamber does not change with $N_2O$ flow indicating that increasing $ClF_3$ reaction does not enhance corrosion.

Our visual inspection of the process chamber following $ClF_3$ cleans with and without $N_2O$ mixing along with the above FTIR results, indicate that $N_2O$ addition to $ClF_3$ improves $ClF_3$ reaction and enhances chamber cleaning, especially on cooler surfaces where reaction with $ClF_3$ alone is less aggressive.

The advantages of this process have included the following:

Mixing nitrous oxide with $ClF_3$ will enhance the dissociation process of $ClF_3$ and improves iii-situ cleaning of $TiI_4$-based Ti and TiN films in metal CVD equipment.

The addition of $N_2O$ shows no increase in corrosion of Inconel, alumina and quartz components of the CVD reactor.

The addition of $N_2O$ increases the fraction of reacted $ClF_3$ inside the CVD reactor and reduces reaction in downstream components of process module (trap, dry pump and exhaust pipes) reducing corrosion and lengthening their lifetime.

Striking an RF plasma with $N_2O/ClF_3$ flow in a parallel plate capacitor configuration will further enhance the cleaning process.

Reducing the flow rates of $N_2O$ and $ClF_3$ to 100 sccm each and cleaning pressure to 0.1 Torr or less improves the cleaning of the wall and bottom plate of the process chamber.

It should also be noted that even though the cleaning gas mixture of nitrous oxide or nitrous dioxide and chlorine trifluoride was employed, other cleaning gases that will react and will etch away deposited metal containing material from a deposition chamber may also be employed.

What is claimed is:

1. A process for cleaning a metallic byproduct film from an interior surface of a chamber of an apparatus for processing a substrate, the method comprising the steps of:

processing at least one substrate in said chamber by depositing a metallic film onto said substrate by chemical vapor deposition using a metal halide precursor whereby said metallic byproduct film is formed on said interior surface of said chamber, said metallic byproduct film comprising said metal and said halide, introducing a cleaning gas containing chlorine trifluoride into said chamber, introducing an oxidizing gas containing an oxidizing reagent into said chamber, establishing within said chamber an environment having a selected temperature and a selected pressure, to thereby react said cleaning gas and said oxidizing gas with said metallic byproduct film within said chamber to produce a volatile reaction product, and discharging said volatile reaction product from said chamber.

2. A process according to claim 1 including the further act of mixing said cleaning gas and said oxidizing gas.

3. A process according to claim 1 wherein said establishing an environment includes the further act of providing a plasma within said chamber.

4. A process according to claim 1 including introducing said cleaning gas and said oxidizing gas and reacting said gases with said metallic byproduct film for a first period of time, and thereafter striking a plasma within said chamber and reacting said plasma with said metallic byproduct film for a second period of time.

5. A process according to claim 1 wherein said introducing a cleaning gas includes flowing said cleaning gas at a flow rate of about 100 sccm into said chamber having a pressure of about 0.1 Torr.

6. A process according to claim 1 wherein said establishing an environment within said chamber includes establishing a temperature within said chamber of between 100° C. and 500° C.

7. A process according to claim 1 wherein said cleaning gas and said oxidizing gas containing an $N_2O$ oxidizing reagent are reacted with said metallic byproduct film to produce said volatile reaction product comprising halogen oxide gas, nitrogen gas and metal halide gas.

8. A process according to claim 1 wherein said processing includes depositing a titanium film by chemical vapor deposition with a titanium halide precursor, and said cleaning gas and said oxidizing gas containing an $N_2O$ oxidizing reagent are reacted with said metallic byproduct film to produce said volatile reaction product comprising halogen oxide gas, nitrogen gas and titanium halide gas.

9. A process according to claim 1 wherein said processing includes depositing a titanium nitride film by chemical vapor deposition with a titanium halide precursor and a nitrogen containing gas, and said cleaning gas and said oxidizing gas containing an $N_2O$ oxidizing reagent are reacted with said metallic byproduct film to produce said volatile reaction product comprising halogen oxide gas, nitrogen gas and titanium halide gas.

10. A process according to claim 1 wherein said oxidizing gas contains $N_2O$.

11. A process according to claim 1 wherein said oxidizing gas contains $N_2O_2$.

12. A process according to claim 1 wherein said oxidizing gas contains $O_2$.

13. A process for cleaning a titanium and halide containing byproduct film from an interior surface of a chamber of an apparatus for processing a substrate, the method comprising the steps of:

processing at least one substrate in said chamber by depositing a titanium containing film onto said substrate by chemical vapor deposition using a titanium halide precursor whereby said titanium and halide containing byproduct film is formed on said interior surface of said chamber, introducing a cleaning gas containing chlorine trifluoride into said chamber, introducing an oxidizing gas containing an $N_2O$ oxidizing reagent into said chamber, striking a plasma of said cleaning gas and said oxidizing gas, establishing within said chamber an environment having a selected temperature and a selected pressure, to thereby react said plasma of said cleaning gas and said oxidizing gas with said titanium and halide containing byproduct film within said chamber to produce a volatile reaction product, and discharging said volatile reaction product from said chamber.

14. A process according to claim 13 wherein said introducing a cleaning gas includes flowing, said cleaning gas at a flow rate of about 100 sccm into said chamber having a pressure of about 0.1 Torr.

15. A process according to claim 13 wherein said establishing an environment within said chamber includes establishing a temperature within said chamber of between 100° C. and 500° C.

16. A process according to claim 13 wherein said plasma is reacted with said titanium and halide containing byproduct film to produce said volatile reaction product comprising halogen oxide gas, nitrogen gas and titanium halide gas.

17. A process for cleaning byproduct films from interior surfaces of a chamber of an apparatus for processing a substrate, the method comprising the steps of:

processing at least one substrate in said chamber by depositing a titanium containing film onto said substrate by chemical vapor deposition using a titanium halide precursor whereby said titanium containing film is also formed on at least one first interior surface of said chamber and whereby a titanium and halide containing byproduct film is formed on at least one second interior surface of said chamber, introducing a cleaning gas containing chlorine trifluoride into said chamber, introducing an oxidizing gas containing an $N_2O$ oxidizing reagent into said chamber, establishing within said chamber an environment having a selected temperature and a selected pressure, to thereby react said cleaning gas and said oxidizing gas with said titanium containing film on said first interior surface within said chamber to produce a volatile reaction product, striking a plasma of said cleaning gas and said oxidizing gas, establishing within said chamber an environment having a selected temperature and a selected pressure, to thereby react said plasma of said cleaning gas and said oxidizing gas with said titanium and halide containing byproduct film on said second interior surface within said chamber to produce a volatile reaction product, and discharging said volatile reaction product from said chamber.

* * * * *

UNITED STATES PATENT AND TRADEMARK OFFICE

CERTIFICATE OF CORRECTION

PATENT NO. : 6,290,779 B1
DATED : September 18, 2001
INVENTOR(S) : Saleh et al.

It is certified that error appears in the above-identified patent and that said Letters Patent is hereby corrected as shown below:

Column 5,
Line 42, reads "iii-situ" and should read -- in-situ --.

Signed and Sealed this

Nineteenth Day of March, 2002

Attest:

JAMES E. ROGAN
*Director of the United States Patent and Trademark Office*

*Attesting Officer*